United States Patent
Chen et al.

(10) Patent No.: US 7,518,395 B1
(45) Date of Patent: Apr. 14, 2009

(54) IO DRIVER WITH SLEW RATE BOOST CIRCUIT

(75) Inventors: David Jia Chen, Endwell, NY (US); Albert Alexander DeBrita, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/873,033

(22) Filed: Oct. 16, 2007

(51) Int. Cl.
    *H03K 19/003* (2006.01)
(52) U.S. Cl. .......................................... 326/29; 326/27
(58) Field of Classification Search ............. 326/26–27, 326/29, 30; 327/170
    See application file for complete search history.

(56) References Cited

U.S. PATENT DOCUMENTS

| | | | | |
|---|---|---|---|---|
| 5,122,690 A | * | 6/1992 | Bianchi | 326/87 |
| 5,977,790 A | * | 11/1999 | Sanwo et al. | 326/27 |
| 6,130,563 A | * | 10/2000 | Pilling et al. | 327/111 |
| 6,351,172 B1 | * | 2/2002 | Ouyang et al. | 327/333 |
| 6,636,069 B1 | * | 10/2003 | Muljono | 326/30 |

\* cited by examiner

*Primary Examiner*—James H Cho
(74) *Attorney, Agent, or Firm*—Wood, Herron & Evans, LLP

(57) ABSTRACT

An IO driver utilizes a slew rate boost circuit coupled to an IO driver circuit to improve the slew rate of the driver during transitions on the output of the driver. One or more additional output stages are coupled in parallel with a primary output stage of the driver, and are temporarily activated responsive to a transition in an input signal to the driver to effectively decrease the output impedance and boost the pull-up and pull-down time response characteristics of the driver during the transition of the output. The additional output stages are active only for a small part of a cycle, so the slew rate is thereby increased while the effective output impedance during most of the cycle is essentially unaffected.

4 Claims, 2 Drawing Sheets

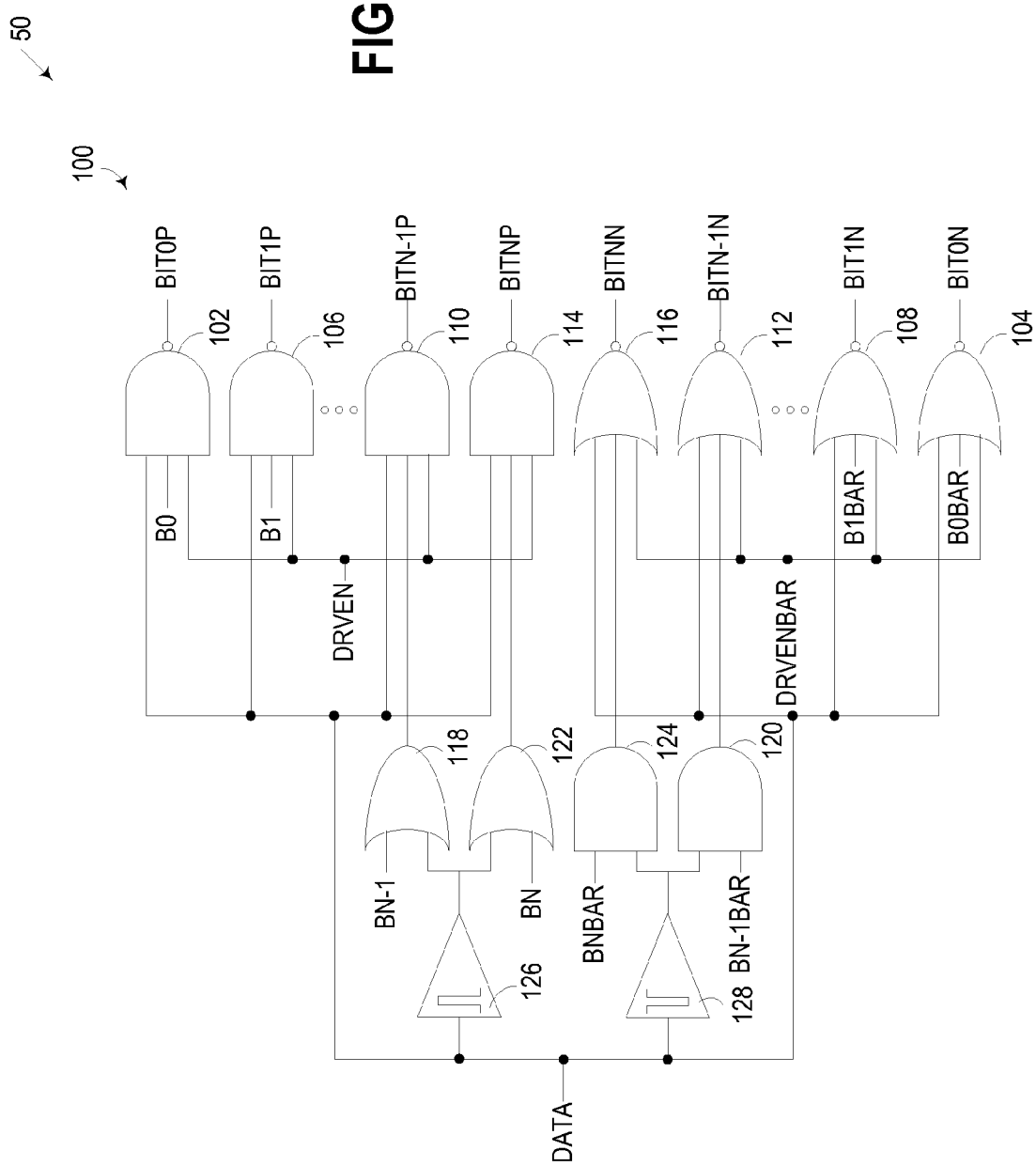

IO DRIVER WITH SLEW RATE BOOST CIRCUIT

FIELD OF THE INVENTION

The invention is generally related to circuit arrangements, and in particular to input/output (IO) driver circuit arrangements.

BACKGROUND OF THE INVENTION

Slew rate and output impedance are often competing parameters in an IO driver circuit design. The slew rate refers to the maximum rate of change for the output voltage of a circuit for all possible input signals. From the perspective of an IO driver that is driven by a binary input signal, the slew rate effectively relates to how quickly the driver can switch the output of the driver between two logic states.

Output impedance generally refers to the characteristic impedance of the output of a circuit. Control over output impedance is typically required for the purpose of impedance matching with a load. When the output impedance of a circuit is mismatched with that of its load, the fidelity of the signal being transmitted can degrade due to reflections and distortions of the signal.

A requirement for high driver output impedance generally introduces delays into a circuit, and as such, often has the net effect of decreasing the slew rate of the circuit. As circuits such as IO drivers are used in increasingly faster and higher performing circuits, however, the need to increase the slew rates of such drivers has increased. Many specifications, on the other hand, require a specific output impedance, and as such, the output impedance cannot simply be scaled down to assist with improving the slew rate of a driver.

To reconcile these conflicting requirements, a need exists in the art for a manner of improving the slew rate of an IO driver while maintaining a desirable output impedance for the driver.

SUMMARY OF THE INVENTION

The invention addresses these and other problems associated with the prior art by providing a design for an IO driver that utilizes a slew rate boost circuit coupled to the driver to improve the slew rate of the driver during transitions on the output of the driver. In particular, driver circuit designs consistent with the invention utilize one or more additional output stages coupled in parallel with a primary output stage, and which are temporarily activated responsive to a transition in an input signal to the driver to effectively decrease the output impedance and boost the pull-up and pull-down characteristics of the driver during the transition of the output. Since the additional output stages are active only for a relatively short period of time, however, the effective output impedance of the driver is essentially unaffected.

Consistent with one aspect of the invention, a circuit arrangement includes a driver circuit comprising an input and an output and configured to output an output signal on the output responsive to an input signal received at the input, the driver circuit comprising an output stage coupled between the input and the output of the driver circuit, the output stage including a first pull-up device and a first pull-down device coupled to the output. The circuit arrangement also includes a slew rate boost circuit coupled to the output of the driver circuit and configured to increase a slew rate of the driver circuit by reducing an output impedance of the driver circuit during transitions in the output signal. The slew rate boost circuit includes a first pulse generator configured to generate a first pulse responsive to a transition in the input signal from a first logic state to a second logic state, a second pulse generator configured to generate a second pulse responsive to a transition in the input signal from the second logic state to the first logic state, a second pull-up device coupled to the output of the driver circuit in parallel with the first pull-up device and configured to activate and reduce the output impedance of the driver circuit responsive to the first pulse from the first pulse generator, and a second pull-down device coupled to the output of the driver circuit in parallel with the first pull-down device and configured to activate and reduce the output impedance of the driver circuit responsive to the second pulse from the second pulse generator.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

BRIEF DESCRIPTION OF THE DRAWINGS

FIGS. 2A and 2B are schematic diagrams of another IO driver circuit arrangement incorporating a slew rate boost circuit consistent with the invention, and including a controllable output impedance.

DETAILED DESCRIPTION

Embodiments consistent with the invention utilize a slew rate boost circuit to assist the output pull-up and pull-down stages of an IO driver circuit during the transition on the output of the circuit to improve the slew rate of the circuit. The assistance is provided by effectively lowering the output impedance of the circuit during the transition by activating additional pull-up and pull-down devices in parallel with the output pull-up and pull-down stages. Once the transition is complete, additional devices are shut off. The slew rate boost devices are typically enabled for such an extremely short and controlled period of time that the effective output impedance of the IO driver circuit is essentially unaltered as a source impedance.

As will also become more apparent below, it may also be desirable in some implementations to utilize in a slew rate boost circuit output devices that already exist as part of an output impedance compensation scheme for an IO driver, thus eliminating the need to add extra devices to the circuit design.

Figure 1:
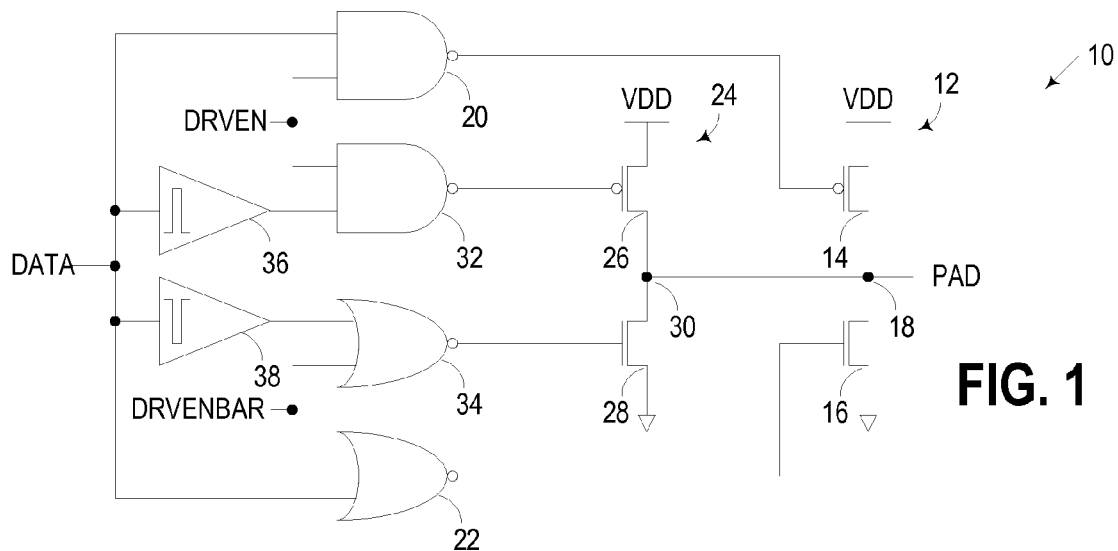
FIG. 1 is a schematic diagram of an IO driver circuit arrangement incorporating a slew rate boost circuit consistent with the invention.

Now turning to the drawings, wherein like numbers denote like parts throughout the several views, FIG. 1 illustrates an exemplary IO driver circuit arrangement 10 configured to pass an input signal at a DATA input to a PAD output, and incorporating a slew rate boost circuit consistent with the invention. Circuit arrangement 10 may be utilized, for example, in an input/output circuit including an output driver and receiver; however, for ease of understanding the receiver block, as well as additional logic blocks such as level shifters and driver enable logic, are not shown in FIG. 1. It will also be appreciated that additional logic may be incorporated into circuit arrangement 10, e.g., were it desirable to invert the input signal prior to outputting it on the PAD output.

Circuit arrangement 10 includes a driver circuit incorporating an output stage 12 including a pull-up device 14 and pull-down device 16 coupled to an output node 18, which outputs a PAD output signal. Pull-up device 14 is coupled between positive power (VDD) and node 18, and is implemented as a p-type field effect transistor (PFET), which is active when the signal applied to its gate is low (logic "0"). Pull-down device 16 is coupled between node 18 and ground, and is implemented as an n-type field effect transistor (NFET), which is active when the signal applied to its gate is high (logic "1").

PFET 14 is activated by a NAND gate 20, which receives as input the input signal DATA and an active-high enable signal DRVEN. NFET 16 is activated by a NOR gate 22, which receives as input the input signal DATA and an inverted (active-low) enable signal, DRVENBAR. In order to activate or enable the driver, DRVEN is asserted high and DRVENBAR is asserted low. Consequently, whenever DATA is high and the driver is active, NAND gate 20 will be driven low, which activates PFET 14, tying output node 18 to VDD, and outputting a high PAD output. Conversely, whenever DATA is low and the driver is active, NOR gate 20 will be driven high, which activates NFET 16, tying output node 18 to ground, and outputting a low PAD output.

Circuit arrangement 10 additionally includes a slew rate boost circuit that includes an additional output stage 24 coupled in parallel with output stage 12. Output stage 24 includes a pull-up device 26 and a pull-down device 28 coupled to a node 30 that is tied to output node 18. Pull-up device 26 is implemented as a PFET coupled between VDD and node 30, while pull-down device 28 is implemented as an NFET coupled between node 30 and ground.

PFET 26 and NFET 28 are respectively driven by a NAND gate 32 and a NOR gate 34. NAND gate 32 receives the DRVEN enable signal as one input, with the other input coupled to the output of a pulse generator 36. NOR gate 34 receives the DRVENBAR enable signal as one input, with the other input coupled to the output of a pulse generator 38. Pulse generator 36 is an up pulse generator, and is configured to generate a high pulse responsive to a low-to-high transition in the DATA input signal. Conversely, pulse generator 38 is a down pulse generator, and is configured to generate a low pulse responsive to a high to low transition in the DATA input signal.

In steady state, the output of pulse generator 36 is low while the output of pulse generator 38 is high. When the DATA input signal switches from low to high, pulse generator 36 creates a positive pulse, and if the driver is enabled, the positive pulse is propagated to PFET 26 by NAND 32 to activate the additional pull-up device and assist PFET 14 with the low to high transition at the PAD output. While the pulse is high, the gate of PFET 26 is low, lowering the effective output impedance at the PAD output. Once the pulse drops back to a low state, however, the gate on PFET 26 will go high, turning it off, and returning the output impedance to the steady state, i.e., non-transient condition.

A similar set of events occur when the DATA input signal switches from high to low, whereby pulse generator 38 creates a negative pulse, which (if the driver is enabled) propagates through NOR gate 34 and pulls the gate of NFET 28 high, activating the NFET and assisting NFET 16 with the high to low transition at the PAD output. Once the pulse is over, pulse generator 38 returns to its high state, the gate of NFET 28 is pulled low and the device is turned off.

It will be appreciated that during steady state conditions, when no transitions occur, the output impedance of circuit arrangement 10 is principally controlled by the dimensions of PFET 14 and NFET 16. However, when a transition does occur, either PFET 26 (for a low to high transition) or NFET 28 (for a high to low transition) is activated to effectively lower the output impedance at the PAD output during the transition. The degree to which the impedance is lowered will vary depending upon the dimensions of PFET 26 and NFET 28.

It will be appreciated that the dimensions of PFETs 14, 26 and NFETs 16, 28 may vary in different embodiments, depending upon the output impedance requirements of the circuit, as well as the required slew rate. It will also be appreciated that multiple additional output stages (e.g., multiple PFETs and multiple NFETs) may be coupled in parallel with output stage 12 in order to provide a desired slew rate boost.

The length of the pulses generated by pulse generators 36 and 38 may also vary in different embodiments. It is generally desirable for the pulse width of the pulse generators to be long enough so that the slew rate is sufficiently increased throughout the output transition, but not so long as to have an adverse affect on the overall output impedance of the circuit arrangement. For example, it may be desirable to select a pulse width that ensures that the pulse will be active during the entire transition period for the PAD output.

Figure 2A:
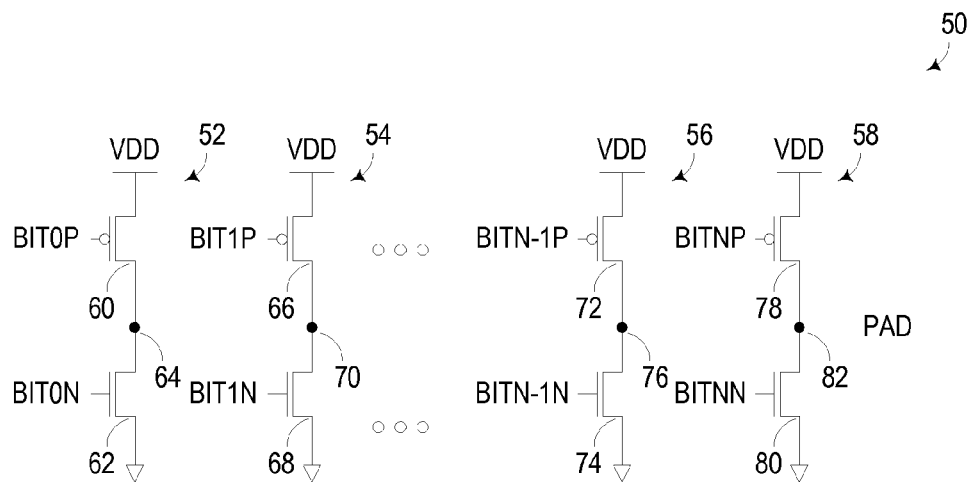

Now turning to FIGS. 2A and 2B, as noted above, it may also be desirable to implement the slew rate boost technique described herein in conjunction with driver circuit configurations featuring output impedance compensation. As shown in FIG. 2A, for example, an IO driver circuit arrangement 50 may include a multi-stage arrangement including a plurality of parallel output stages 52, 54, 56, 58 (also denoted as stages 0 . . . N) coupled to a PAD output for the driver. Output stage 0, or 52, includes a pull-up PFET 60 and pull-down NFET 62 coupled to one another at an output node 64, with PFET 60 coupling node 64 to VDD and NFET 62 coupling node 64 to ground. A pair of output stage enable signals, Bit0P and Bit0N, respectively control PFET 60 and NFET 62. Similarly, output stage 1, or 54, includes a pull-up PFET 66 and pull-down NFET 68 coupled to one another at an output node 70, with PFET 66 coupling node 70 to VDD and NFET 68 coupling node 70 to ground. A pair of output stage enable signals, Bit1P and Bit1N, respectively control PFET 66 and NFET 68.

For the remainder of the output stages (stages 2 . . . N), a similar configuration is provided. Thus, as shown in FIG. 2A, for output stage N–1, or 56, BitN-1P and BitN-1N signals respectively control a PFET 72 and NFET 74 joined at a common node 76, and for output stage N, or 58, BitNP and BitNN signals respectively control a PFET 78 and NFET 80 joined at a common node 82.

The pull-up and pull-down devices in each output stage 0 . . . N are desirably binary weighted such that the device in each output stage X is roughly twice as large as the corresponding device in output stage X–1, and as such, through selectively enabling the devices in selected output stages, the output impedance of the driver can be controlled.

In the illustrated embodiment, for example, the multi-stage arrangement of FIG. 2A may be utilized for a GDDR3 IO driver design that incorporates an external controller calibrated output stage, so that the output impedance may be tuned by a feedback circuit utilizing an external resistor standard. Binary weighted bit control inputs (B0 . . . BN) and their inverted counterparts (B0BAR . . . BNBAR) are generated by the controller, and are continuously enabled or disabled to maintain constant output impedance despite varying parametric, voltage, and temperature conditions.

Also in the illustrated embodiment, a subset of the output stages, in this case the top two output stages N–1 and N are selectively utilized for both slew rate boost as well as impedance compensation. FIG. 2B, for example, illustrates one manner in which a slew rate boost circuit may be incorporated into the generation logic 100 for the output stage enable signals (Bit0P . . . BitNP and Bit0N . . . BitNN) of IO driver circuit arrangement 50.

Generation logic 100 receives as input the DATA input signal and a set of bit control inputs (B0 . . . BN) and their inverted counterparts (B0BAR . . . BNBAR). Logic 100 also receives the complementary driver enable signals (DRVEN and DRVENBAR). For output stage 0, the Bit0P output stage enable signal is driven by a NAND gate 102 that receives as input the DATA input signal, the DRVEN signal and the respective bit control input B0, such that Bit0P will be asserted low, and the corresponding PFET will be activated, whenever the DATA input is high, the driver is enabled by asserting DRVEN high, and the output stage is activated by asserting B0 high. Likewise, the Bit0N output stage enable signal is driven by a NOR gate 104 that receives as input the DATA input signal, the DRVENBAR inverted enable signal and the respective inverted bit control input B0BAR, such that Bit0N will be asserted high, and the corresponding NFET will be activated, whenever the DATA input is low, the driver is enabled by asserting DRVENBAR low, and the output stage is activated by asserting B0BAR low. A similar configuration is shown for output stage 1, whereby the Bit1P and Bit1N output stage enable signals are generated by NAND gate 106 and NOR gate 108, and are responsive in part to bit control inputs B1 and B1 BAR.

For output stages N−1 and N, however, slew rate boost control circuitry is incorporated to utilize these stages for the purpose of slew rate boost whenever the output stages are not otherwise enabled for the purposes of impedance compensation. Specifically, for output stage N−1, the BitN-1P output stage enable signal is driven by a NAND gate 110 that receives as input the DATA input signal, the DRVEN signal and the output of an OR gate 118, and the BitN-1N output stage enable signal is driven by a NOR gate 112 that receives as input the DATA input signal, the DRVENBAR inverted enable signal and the output of an AND gate 120.

For output stage N, the BitNP output stage enable signal is driven by a NAND gate 114 that receives as input the DATA input signal, the DRVEN signal and the output of an OR gate 122, and the BitNN output stage enable signal is driven by a NOR gate 116 that receives as input the DATA input signal, the DRVENBAR inverted enable signal and the output of an AND gate 124.

OR gates 118 and 122 respectively receive as input the respective bit control inputs B1-N and BN. Both OR gates 118, 122 additionally receive as input the output of an up pulse generator 126. AND gates 120 and 124 respectively receive as input the respective inverted bit control inputs B1-NBAR and BNBAR. Both AND gates 120, 124 additionally receive as input the output of a down pulse generator 128.

Whenever output stage N−1 or N is enabled for the purpose of impedance compensation, the respective bit control inputs (BN-1 and BN-1 BAR for stage N−1, and BN, BNBAR for stage N) are asserted, such that the respective OR gate 118, 122 is held high and the respective AND gate 120, 124 is held low. Consequently, the appropriate output stage enable signals will be asserted to activate the associated output stages.

Whenever output stage N−1 or N is not enabled for the purpose of impedance compensation, however, circuit 100 operates in a similar manner to circuit arrangement 10 of FIG. 1. Specifically, during a transition in the DATA input signal from low to high, pulse generator 126 outputs a positive pulse, which drives OR gates 118 and 122 to high. As long as the driver is enabled by asserting DRVEN high, NAND gates 110, 114 will be driven low, thus asserting BitN-1P and BitNP low, and activating the N−1 and N stage PFETs 72, 78. Likewise, during a transition in the DATA input signal from high to low, pulse generator 128 outputs a negative pulse, which drives AND gates 120 and 124 to a low state. As long as the driver is enabled by asserting DRVENBAR low, NOR gates 112, 116 will be driven high, thus asserting BitN-1N and BitNN high, and activating the N−1 and N stage NFETs 74, 80. Upon the completion of a pulse, stages N−1 and N are deactivated until the next transition in the DATA input signal.

Various modifications may be made without departing from the spirit and scope of the invention. For example, different devices sizes, different devices (e.g., non-FET devices), different pulse widths, and different numbers of output stages may be used to implement the herein described slew rate boost technique. Other circuit modifications, consistent with the general principles disclosed, will be appreciated by one of ordinary skill in the art. Therefore, the invention lies in the claims hereinafter appended.

What is claimed is:

1. A circuit arrangement, comprising:
    a driver circuit comprising an input and an output and configured to output an output signal on the output responsive to an input signal received at the input, the driver circuit comprising an output stage coupled between the input and the output of the driver circuit, the output stage including a first pull-up device and a first pull-down device coupled to the output; and
    a slew rate boost circuit coupled to the output of the driver circuit and configured to increase a slew rate of the driver circuit by reducing an output impedance of the driver circuit during transitions in the output signal, the slew rate boost circuit comprising:
        a first pulse generator configured to generate a first pulse responsive to a transition in the input signal from a first logic state to a second logic state;
        a second pulse generator configured to generate a second pulse responsive to a transition in the input signal from the second logic state to the first logic state;
        a second pull-up device coupled to the output of the driver circuit in parallel with the first pull-up device and configured to activate and reduce the output impedance of the driver circuit responsive to the first pulse from the first pulse generator; and
        a second pull-down device coupled to the output of the driver circuit in parallel with the first pull-down device and configured to activate and reduce the output impedance of the driver circuit responsive to the second pulse from the second pulse generator;
    wherein the first pulse generator is an up pulse generator and the second pulse generator is a down pulse generator, wherein the first and second pull-up devices are PFET devices coupled between the output of the driver circuit and VDD, wherein the first and second pull-down devices are NFET devices coupled between the output of the driver circuit and ground, and wherein the circuit arrangement further comprises first and second NAND gates, the first NAND gate having a first input coupled to receive a driver enable signal, a second input coupled to receive the input signal, and an output coupled to a gate input of the first pull-up device, and the second NAND gate having a first input coupled to receive the driver enable signal, a second input coupled to receive the first pulse, and an output coupled to a gate input of the second pull-up device.

2. The circuit arrangement of claim 1, further comprising first and second NOR gates, the first NOR gate having a first input coupled to receive an inverted driver enable signal, a second input coupled to receive the input signal, and an output coupled to a gate input of the first pull-down device, and the second NOR gate having a first input coupled to receive the inverted driver enable signal, a second input coupled to receive the second pulse, and an output coupled to a gate input of the second pull-down device.

3. The circuit arrangement of claim 1, wherein the first pull-up device and first pull-down device are disposed in an impedance compensation circuit, the impedance compensation circuit configured to selectively enable one or more pull-up and pull-down devices to control the output impedance of the driver circuit.

4. The circuit arrangement of claim 3, wherein the pull-up and pull-down devices in the impedance control circuit are binary weighted and selectively enabled by a plurality of binary weighted enable signals.

* * * * *